US012136680B2

United States Patent
Song et al.

(10) Patent No.: US 12,136,680 B2
(45) Date of Patent: Nov. 5, 2024

(54) ARCHITECTURE FOR EFFICIENT MONOLITHIC BIFACIAL PEROVSKITE-CDSETE TANDEM THIN FILM SOLAR CELLS AND MODULES

(71) Applicant: The University of Toledo, Toledo, OH (US)

(72) Inventors: Zhaoning Song, Toledo, OH (US); Kamala Khanal Subedi, Toledo, OH (US); Randy Ellingson, Toledo, OH (US); Yanfa Yan, Toledo, OH (US)

(73) Assignee: The University of Toledo, Toledo, OH (US)

( * ) Notice: Subject to any disclaimer, the term of this patent is extended or adjusted under 35 U.S.C. 154(b) by 0 days.

(21) Appl. No.: 17/529,682

(22) Filed: Nov. 18, 2021

(65) Prior Publication Data

US 2022/0199845 A1    Jun. 23, 2022

Related U.S. Application Data

(60) Provisional application No. 63/127,280, filed on Dec. 18, 2020.

(51) Int. Cl.
*H01L 31/073* (2012.01)
*H01L 31/18* (2006.01)

(52) U.S. Cl.
CPC ........ *H01L 31/073* (2013.01); *H01L 31/1884* (2013.01)

(58) Field of Classification Search
CPC ............... H01L 31/048; H01L 31/0488; H01L 31/0687; H01L 31/0725; H01L 31/073
See application file for complete search history.

(56) References Cited

U.S. PATENT DOCUMENTS

| | | | |
|---|---|---|---|
| 8,124,870 B2 | 2/2012 | Woods et al. | |
| 10,181,538 B2 | 1/2019 | Ning et al. | |
| 10,319,534 B2 | 6/2019 | Yan et al. | |
| 10,777,693 B2 | 9/2020 | Snaith et al. | |
| 2009/0020149 A1* | 1/2009 | Woods ............... | H01L 31/1884 427/76 |
| 2010/0186813 A1* | 7/2010 | Knoll .................... | H01L 31/056 219/616 |
| 2017/0250030 A1 | 8/2017 | Druffel et al. | |
| 2018/0174761 A1* | 6/2018 | Kamino ................ | H10K 30/87 |
| 2018/0175112 A1* | 6/2018 | Robinson ............. | H01L 27/302 |
| 2018/0240606 A1 | 8/2018 | Bawendi et al. | |
| 2019/0148574 A1 | 5/2019 | Saive et al. | |

(Continued)

FOREIGN PATENT DOCUMENTS

WO   WO-2020120991 A1 *  6/2020   .......... H01L 27/302

OTHER PUBLICATIONS

Zhao, B., Lian, Y., Cui, L., et al., Efficient Light-Emitting Diodes from Mixed-Dimensional Perovskites on a Fluoride Interface, Nature Electronics, Oct. 19, 2020, 3, pp. 704-710.

(Continued)

*Primary Examiner* — Mayla Gonzalez Ramos
(74) *Attorney, Agent, or Firm* — Standley Law Group LLP; Jeffrey S. Standley; Kenny W. Pung (57) ABSTRACT

An optoelectronic device comprising two photovoltaic absorber materials of CdSeTe and perovskite and their functional component layers that are monolithically integrated into a bifacial tandem solar cell structure.

1 Claim, 12 Drawing Sheets

(56) References Cited

U.S. PATENT DOCUMENTS

2019/0341506 A1* 11/2019 Sampath ........... H01L 31/02963
2020/0082995 A1    3/2020 Woods
2022/0037407 A1*  2/2022 Snaith ............. H01L 31/022475

OTHER PUBLICATIONS

Chongwen Li, Zhaoning Song, et al., Low-Bandgap Mixed Tin-Lead Iodide Perovskites with Reduced Methylammonium for Simultaneous Enhancement of Solar Cell Efficiency and Stability, Nature Energy, Oct. 2020, 5, pp. 768-776.

* cited by examiner

ARCHITECTURE FOR EFFICIENT MONOLITHIC BIFACIAL PEROVSKITE-CDSETE TANDEM THIN FILM SOLAR CELLS AND MODULES

GOVERNMENT LICENSE RIGHTS

This invention was made with government support under DE-EE0008753 awarded by the Department of Energy and FA9453-19-C-1002 awarded by the Air Force Research Laboratory. The government has certain rights in the invention.

BACKGROUND OF THE INVENTION

This invention relates to the field of solar cells, and in particular, to an architecture design for monolithic bifacial perovskite-CdSeTe tandem solar cells and modules and a method for preparing monolithic bifacial perovskite-CdSeTe tandem solar cells and modules.

Photovoltaic solar cells are optoelectronic devices that absorb sunlight and convert it into electricity. Typical photovoltaic solar cells are single-junction devices comprising a semiconductor absorber layer and other functional components that are used to construct an electrical photodiode. A bifacial solar cell comprises two optically transparent and electrically conductive electrodes that allow light entering the device from both the front and back sides. A two-junction tandem solar cell comprises two or more semiconductor absorber layers with different bandgaps that are integrated into a single device unit. The tandem structure allows complementary absorption of the solar spectrum and can achieve higher solar-to-electricity power conversion efficiency.

Photovoltaic solar cells can be made by a variety of semiconductor materials. In particular, thin-film photovoltaic materials are made with semiconductor compounds or alloys using cadmium, tellurium, sulfur, selenium, zinc, indium, gallium, tin, and copper are used in the commercial fabrication of photovoltaic solar cells, modules, and panels. Cadmium selenium telluride (CdSeTe)-based thin-film photovoltaic technology is one type of solar cell with high efficiency, low cost, and robust stability. The bandgap of CdSeTe can be adjusted by changing the ratios of tellurium and selenium or incorporating zinc, magnesium, and sulfur into the composition. The highest record conversion efficiency of 22.1% has been demonstrated in small-area devices. Metal halide perovskites, comprising of monovalent organic or inorganic cations, divalent metal cations, and halide ions, are another family of emerging photovoltaic materials. The bandgap of perovskite can be varied by controlling the ratios of halide anions (iodine, bromine, chlorine) in the compositions. Record efficiency of 25.5% has been achieved in small area devices.

The integration of CdSeTe and perovskite materials into a bifacial perovskite-CdSeTe tandem solar cell is a feasible approach to fabricate low-cost high-performance thin-film solar cells. There is a need for the unique bifacial tandem device structure of perovskite-CdSeTe tandem solar cells to realize a high-power conversion efficiency. This structure can be applied directly to the manufacturing of commercial CdSeTe solar cells to enable the potential to achieve a high-power conversion efficiency of more than 40%.

SUMMARY OF THE INVENTION

The invention herein is an optoelectronic device comprising two photovoltaic absorber materials of CdSeTe and perovskite and their functional component layers that are monolithically integrated into a bifacial tandem solar cell structure. The perovskite absorber has a wider bandgap than the CdSeTe absorber and therefore is referred as to the top subcell, whereas the CdSeTe absorber is referred as to the bottom subcell. This bifacial tandem design has two transparent and conductive electrodes that allow illumination from both sides of the device. The primary illumination direction is from the perovskite subcell, and the secondary illumination direction is the CdSeTe. For practical application, solar light incidents on the surface of the top electrode of the perovskite subcell; some of the scattered and reflected light incidents on the surface of the glass substrate of the CdSeTe subcell. The bifacial illumination is necessary to sustain the current match condition in the tandem solar cells, enabling the efficient conversion of solar energy to electricity. Accordingly, the present invention also provides a method of preparing the bifacial Perovskite-CdSeTe tandem cells.

Other objects and advantages of the present invention will become apparent to those skilled in the art upon a review of the following detailed description of the preferred embodiments and the accompanying drawings.

DETAILED DESCRIPTION OF THE INVENTION

Figure 1:
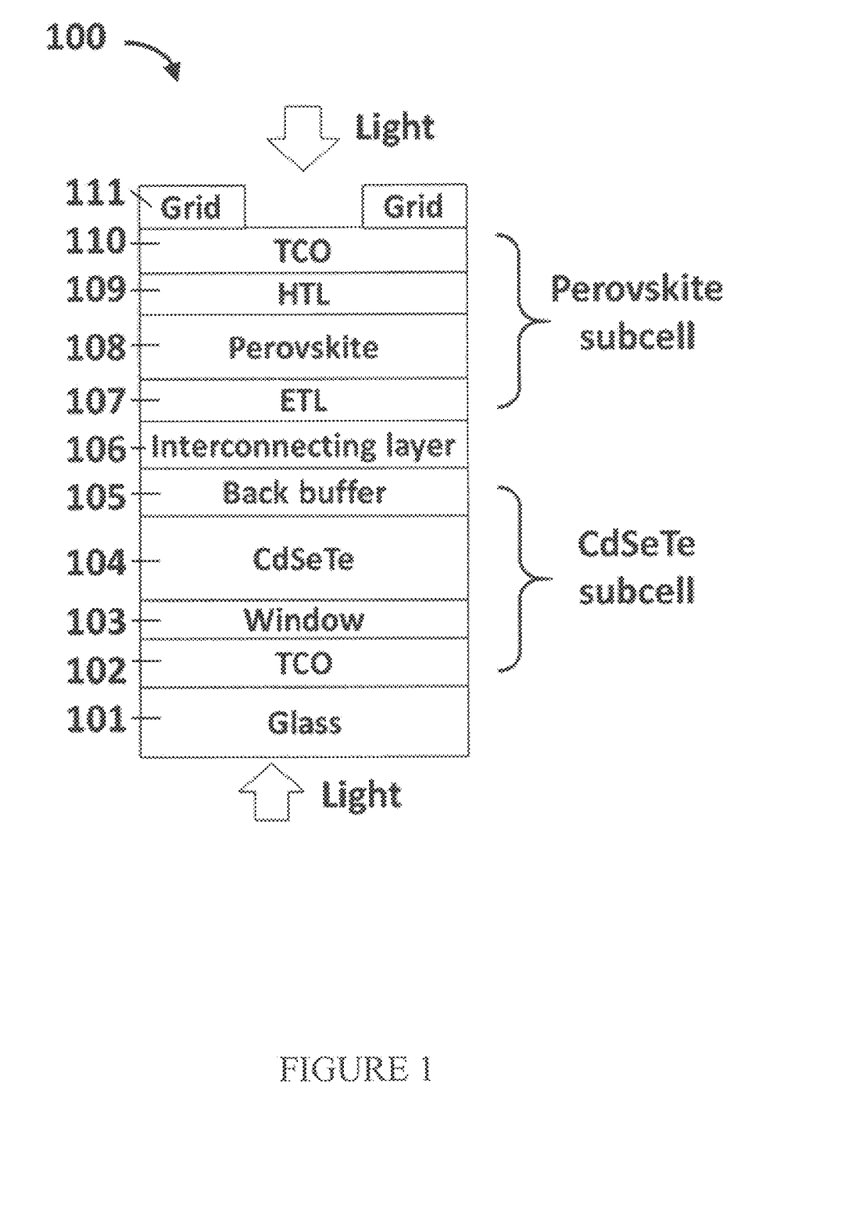
FIG. 1 is an illustration of a cross-sectional view of a bifacial Perovskite-CdSeTe tandem solar cell structure 100. A tandem device comprises a CdSeTe subcell and a perovskite subcell monolithically integrated by an interconnecting layer. Light can enter a bifacial Perovskite-CdSeTe tandem solar cell from both sides of the device.

The optoelectronic tandem device 100 fabrication comprises the following steps:

S101: preparing a transparent conducting oxide (TCO) electrode 102 coated glass substrate 101. TCO layer includes materials such as fluorine-doped tin oxide (FTO) 115, indium tin oxide (ITO) 116, aluminum-doped zinc oxide (AZO) 117, indium doped zinc oxide (IZO), hydrogen doped indium oxide (IO:H) and others. This layer can be prepared by sputtering, chemical bath deposition, and other methods. The TCO layer has a thickness of 100 to 300 nm.

S102: depositing an n-type window layer 103 for CdSeTe solar cells. Window layer materials are metal compounds comprising of elements of cadmium, oxygen, sulfide, selenide, zinc, magnesium, tin, indium. This layer can be prepared by sputtering, chemical bath deposition, physical vapor deposition, atomic layer deposition, electrochemical deposition, and other methods. The window layer has a thickness of 5 to 100 nm. The window layer is optional and can be omitted in some cases.

S103: depositing CdSeTe absorber layer 104. The molecular ratio of Cd to Se in the chemical composition of Cd$_x$Se$_{1-x}$Te determines the absorption bandgap of the CdSeTe absorber layer. The CdSeTe absorber layer is treated with CdCl$_2$ heat treatment and is doped with Cu or a group-V dopant, including phosphorus (P), arsenic (As), antimony (Sb), bismuth (Bi). This layer can be prepared by sputtering, sublimation, physical vapor deposition, and other methods. The CdSeTe layer has a thickness of 500 to 5000 nm.

S104: forming a back buffer surface layer 105 for CdSeTe devices. The back buffer layer typically has p-type conductivity and provides an Ohmic contact to the rear electrode of CdSeTe solar cells. This layer is optional and sometimes refers to as a back surface treatment in CdTe-based photovoltaic technology. The back surface layer can be a pure substance or metal compounds. The elements used in this layer include zinc, magnesium, copper, aluminum, gallium, chromium, iron, oxygen, sulfur, selenium, tellurium, iodine, bromine, chlorine, carbon, and others. This layer can also be organic or small molecule materials such as 2,2',7,7'-Tetrakis[N,N-di(4-methoxyphenyl)amino]-9,9'-spirobifluorene (Spiro-OMeTAD) 118, 2,2',7,7'-Tetra(N,N-di-p-tolyl)amino-9,9-spirobifluorene (Spiro-TTB), Poly[bis(4-phenyl)(2,4,6-trimethylphenyl)amine] (PTAA), Poly(3-hexylthiophene-2,5-diyl) (P3HT), Poly(3,4-ethylenedioxythiophene)-poly(styrenesulfonate) (PEDOT:PSS), Poly(4-butyltriphenylamine) (Poly-TPD), copper(II) phthalocyanine (CuPc), zinc phthalocyanine (ZnPc), copper(II) thiocyanate (CuSCN), etc. This layer can be prepared by sputtering, evaporation, sublimation, physical vapor deposition, chemical solution, and other methods. This layer has a thickness of 5 to 100 nm.

S105: depositing an interconnecting layer 106. This layer provides electrical connections of perovskite and CdSeTe subcells. This layer can be metal compounds or organic materials. The elements used in this layer include zinc, indium, tin, magnesium, aluminum, oxygen, sulfur, selenium, tellurium, carbon, and others. This layer can be prepared by sputtering, evaporation, atomic layer deposition, spin-coating, blade coating, spraying, slot-die coating, and other methods. The interconnecting layer has a thickness of 10 to 120 nm. The interconnecting layer is also called the recombination layer. The interconnecting layer is optional and can be omitted in some cases.

S106: depositing electron transport layer (ETL) 107 for the perovskite subcell. ETL materials are typically metal compounds comprising of elements of tin, titanium, zinc, indium, gallium, aluminum, niobium, oxygen. This layer can also be organic or small molecule materials such as fullerene (C$_{60}$) and its derivatives, phenyl-C61-butyric acid methyl ester (PCBM). This layer can be prepared by sputtering, evaporation, atomic layer deposition, spin-coating, blade coating, spraying, slot-die coating, and other methods. The ETL has a thickness of 10 to 50 nm.

S107: depositing perovskite absorber layer 108. Perovskite materials comprise of elements of carbon, nitrogen, hydrogen, cesium, rubidium, potassium, lead, tin, germanium, chlorine, bromine, iodine, fluorine, sulfur. The metal halide perovskites have a general chemical formula of ABX$_3$, where A is an organic or inorganic monovalent cation, B is a divalent metal cation, and X is halide ion. Typical A cations include methylammonium (MA), formamidinium (FA), cesium (Cs), rubidium (Rb), and other alkylammonium and arylammonium. Typical B cations include lead (Pb), tin (Sn), germanium (Ge), and other Group IVA metals. Typical X cations include chlorine (Cl), bromine (Br), iodine (I). The chemical composition includes alloys of various perovskites. The bandgap of the perovskite layer can be varied from 1.1 to 3.0 eV by tailoring the perovskite composition. This layer can be prepared by evaporation, chemical vapor deposition, spin-coating, blade coating, spraying, slot-die coating, printing, and other methods. The perovskite absorber layer has a thickness of 200 to 1000 nm.

S108: depositing a hole transport layer (HTL) 109 for the perovskite subcell. HTL materials include p-type organic polymers and molecules and inorganic compounds comprising of elements of carbon, nitrogen, hydrogen, oxygen, sulfur, phosphorus, nickel, copper, zinc, lithium, cobalt, iron, lead, zirconium, hafnium. Typical examples of organic HTLs include 2,2',7,7'-Tetrakis[N,N-di(4-methoxyphenyl)amino]-9,9'-spirobifluorene (Spiro-OMeTAD), 2,2',7,7'-Tetra(N,N-di-p-tolyl)amino-9,9-spirobifluorene (Spiro-TTB), Poly[bis(4-phenyl)(2,4,6-trimethylphenyl)amine] (PTAA), Poly(3-hexylthiophene-2,5-diyl) (P3HT), Poly(3,4-ethylenedioxythiophene)-poly(styrenesulfonate) (PEDOT:PSS), Poly(4-butyltriphenylamine) (Poly-TPD), copper(II) phthalocyanine (CuPc), zinc phthalocyanine (ZnPc), copper(II) thiocyanate (CuSCN), etc. This layer can be prepared by evaporation, chemical vapor deposition, spin-coating, blade coating, spraying, slot-die coating, printing, and other methods. The HTL has a thickness of 10 to 200 nm.

S109: depositing front TCO layer 110. This layer includes materials such as indium tin oxide (ITO), aluminum-doped zinc oxide (AZO), indium doped zinc oxide (IZO), hydrogen doped indium oxide (IO:H) and others. This layer can be prepared by sputtering, evaporation, and other methods. The front TCO layer has a thickness of 100 to 300 nm.

S110: depositing front metal grid 111. The grid materials include silver, gold, aluminum, copper, nickel, indium, chromium, molybdenum, and others. This layer can be prepared by sputtering, evaporation, and other methods. The metal grid has a thickness of 100 to 5000 nm.

It is understood that the photovoltaic devices of the present invention may further include various additional components known in the art, such as additional buffer layers, anti-reflective coatings, encapsulant, front cover glass sheet, and additional wiring or electrical connections.

Examples

This Example describes the application of bifacial $FA_{0.8}Cs_{0.2}Pb(I_{0.7}Br_{0.3})_3$—CdTe tandem solar cells.

Figure 2:
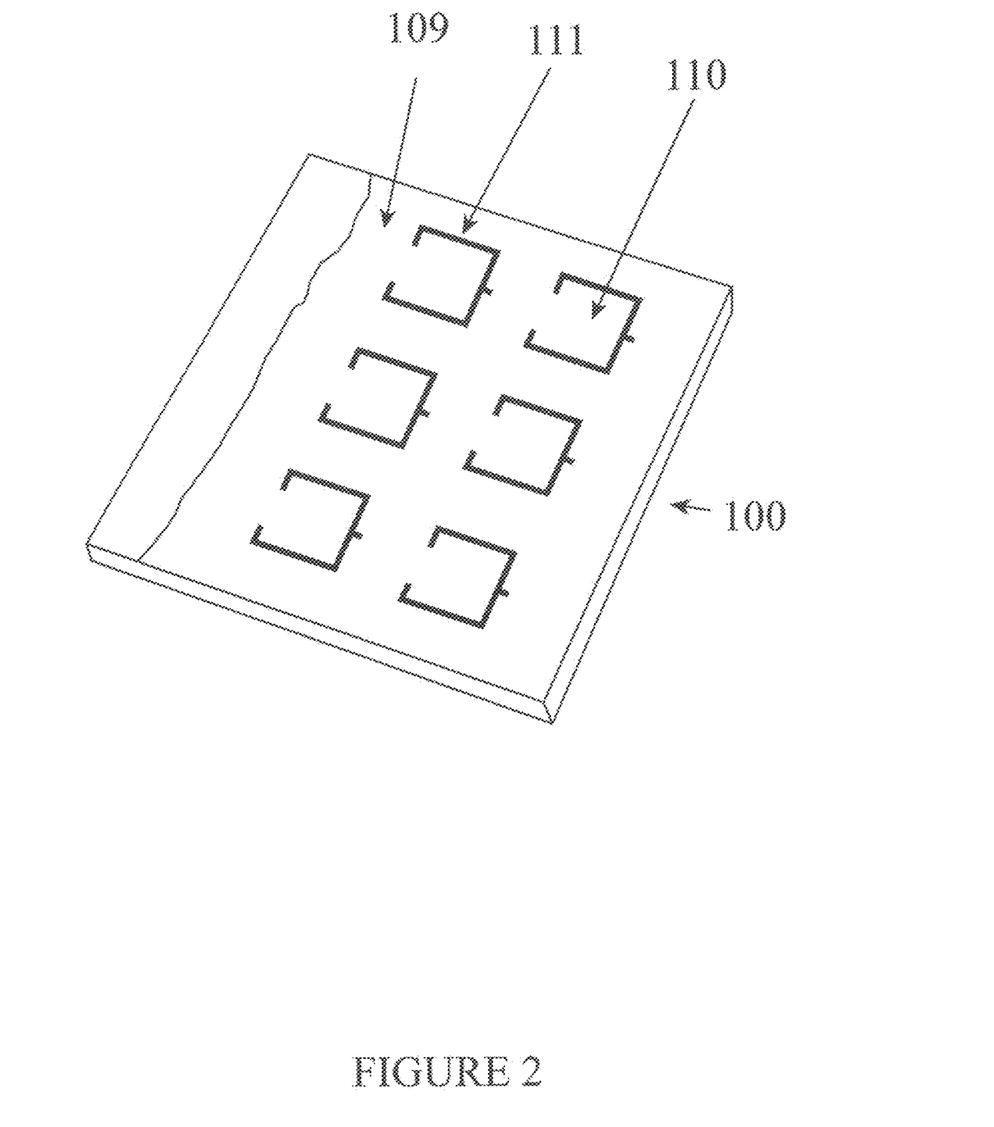
FIG. 2 is a top view of a substrate comprising six bifacial Perovskite-CdSeTe tandem solar cells.

FIG. 2 shows the top view picture of six bifacial tandem solar cells fabricated on a glass substrate following the fabrication process. As an example, the substrate has a size of 1 inch by 1 inch contains six bifacial tandem cells with an active area of 0.25 $cm^2$ for each cell. These devices have been used to demonstrate the device structure design and fundamental photovoltaic performance. The substrate and cell size can be arbitrary and expand to large sizes for minimodule and solar panel applications.

Figure 3:
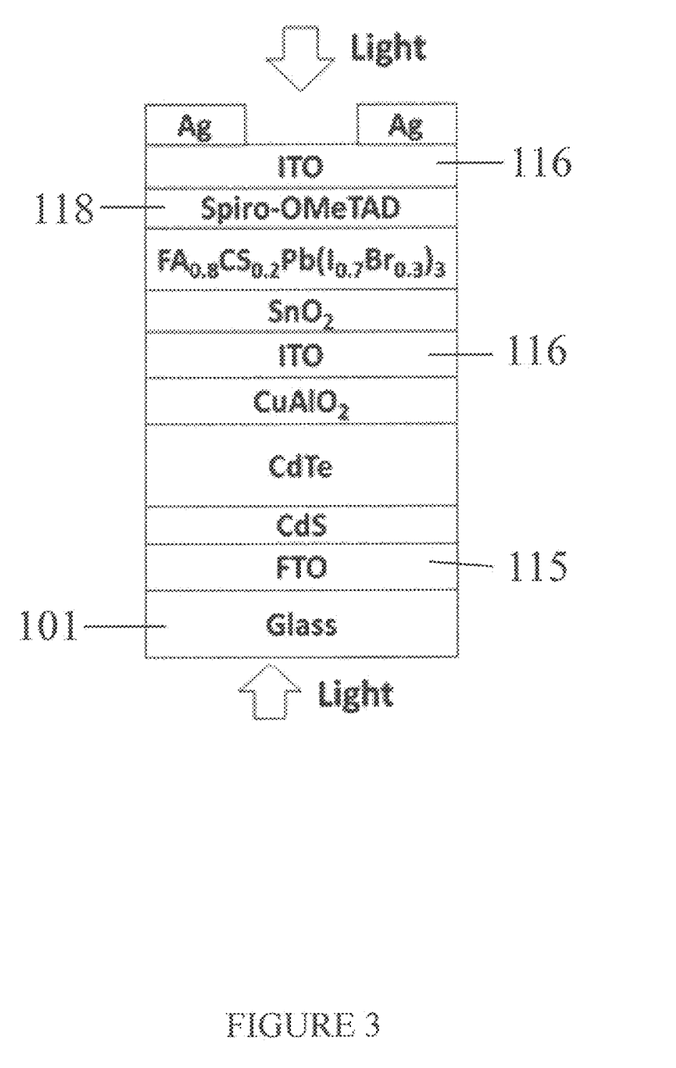
FIG. 3 is an illustration of a cross-sectional view of a bifacial $FA_{0.8}CS_{0.2}Pb(I_{0.7}Br_{0.3})_3$—CdTe tandem solar cell.
Figure 4:
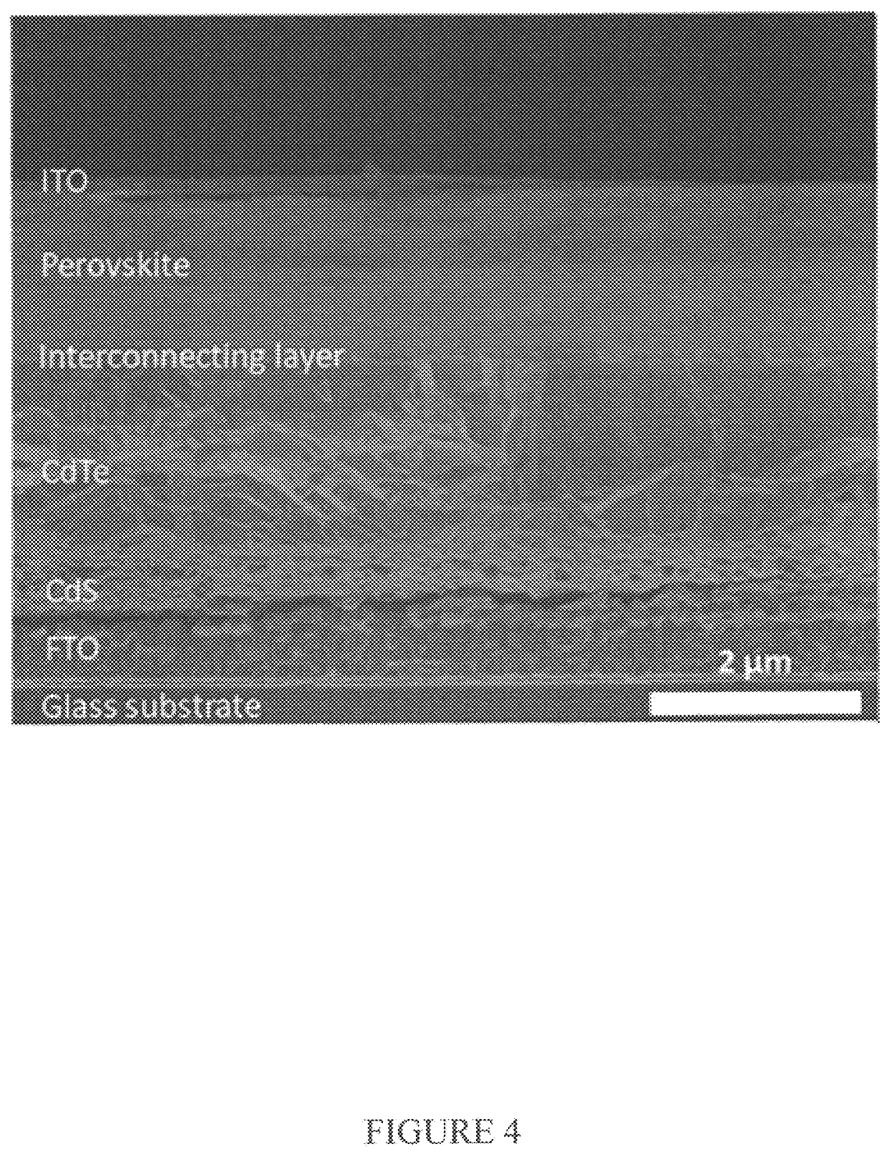
FIG. 4 is a SEM cross-sectional image of a bifacial $FA_{0.8}CS_{0.2}Pb(I_{0.7}Br_{0.3})_3$—CdTe tandem solar cell.

FIG. 3 shows the detailed device structure used in this example, comprising of a film stack of glass/FTO/CdS/CdTe/CuAlO$_2$/ITO/SnO$_2$/FA$_{0.8}$CS$_{0.2}$Pb(I$_{0.7}$Br$_{0.3}$)$_3$/spiro-OMeTAD/ITO/Ag (grid). The CdTe absorber layer has a thickness of 1 to 3 µm and a bandgap of 1.45 eV. The FA$_{0.8}$CS$_{0.2}$Pb(I$_{0.7}$Br$_{0.3}$)$_3$ absorber layer has a thickness of 200 to 350 nm and a bandgap of 1.75 eV. The cross-sectional scanning electron microscopic (SEM) image of a bifacial FA$_{0.8}$CS$_{0.2}$Pb(I$_{0.7}$Br$_{0.3}$)$_3$—CdTe tandem solar cell is shown in FIG. 4.

Figure 5:
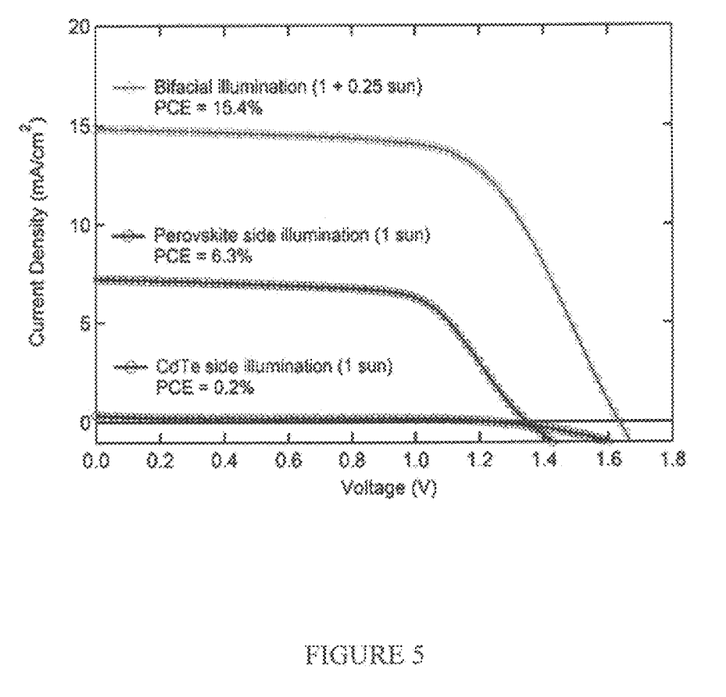
FIG. 5 is a graph displaying current density-voltage curves of a bifacial $FA_{0.8}CS_{0.2}Pb(I_{0.7}Br_{0.3})_3$—CdTe tandem solar cell illuminated concurrently with 1 sun equivalent intensity from the perovskite side and 0.25 sun equivalent intensity from the CdTe side and illuminated from single-side with 1 sun intensity.
Figure 6:
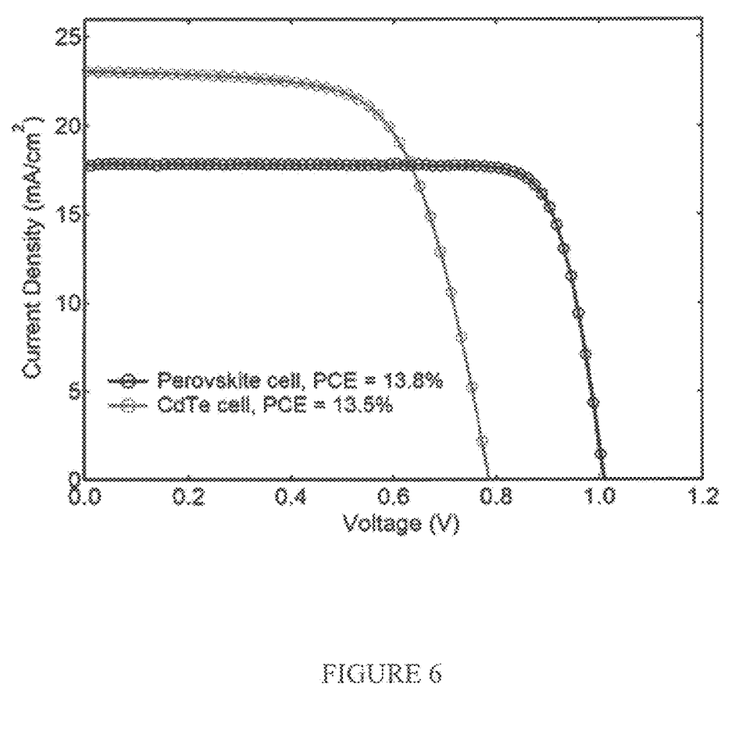
FIG. 6 is a graph displaying current density-voltage curves of single-junction semitransparent perovskite and CdTe solar cells.

An example of current density-voltage characteristics of the bifacial tandem device is shown in FIG. 5. The illumination condition is selected to be a concurrent bifacial light source with the primary light with one Sun intensity, equivalent to 100 mW/cm$^2$, incidents on the top side (perovskite subcell), and the secondary light with approximately 0.25 sun intensity, equivalent to 25 mW/cm$^2$, incidents on the bottom side (CdTe subcell) to mimic the scattered and reflected light from the ground in a practical application. The device delivers a power conversion efficiency of 15.4% with respect to the AM1.5G standard condition and an open-circuit voltage of 1.638 V, a short circuit current density of 14.9 mA/cm$^2$, and a fill factor of 63.1%. FIG. 5 also shows the current density-voltage characteristics of the device under different light illumination conditions, including (1) front-only illumination and (2) back-only illumination, both at 1 Sun intensity. Compared with one-side illumination, bifacial illumination shows a substantial improvement in power conversion. The bifacial perovskite-CdTe tandem cell exhibits a higher power output than corresponding semi-transparent single-junction wide-bandgap perovskite cell and CdTe cell with power conversion efficiencies of 13.8% and 13.5%, respectively, as shown in the J-V curves in FIG. 6.

Another example is given for a bifacial perovskite-CdSeTe tandem cell based on the combination of a MAPbI$_3$ perovskite top subcell and a CdSeTe bottom subcell.

Figure 7:
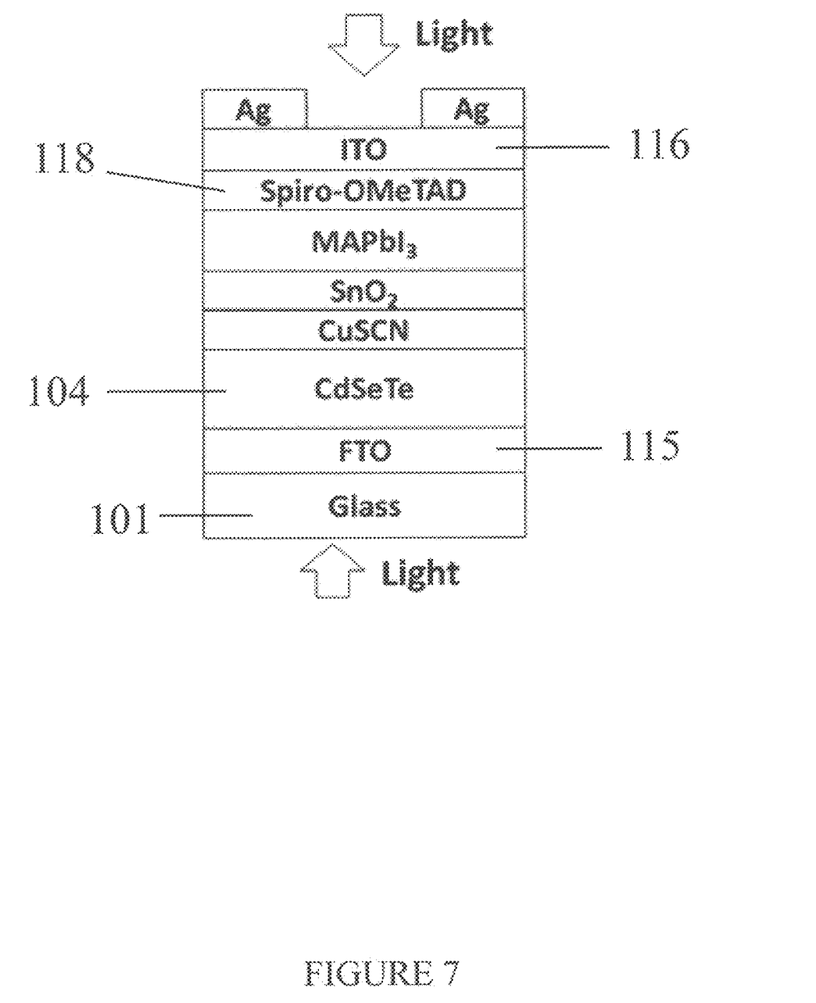
FIG. 7 is an illustration of a cross-sectional view of a bifacial $MAPbI_3$—CdSeTe tandem solar cell.

FIG. 7 shows the detailed device structure used in this example, comprising of a film stack of glass/FTO/CdSeTe/CuSCN/SnO$_2$/MAPbI$_3$/spiro-OMeTAD/ITO/Ag (grid). The CdSeTe absorber layer has a thickness of 2 to 4 µm and a bandgap of 1.35 eV. The MAPbI$_3$ absorber layer has a thickness of 300 to 700 nm and a bandgap of 1.60 eV. This kind of bifacial tandem device does not require an interconnecting layer. The perovskite and CdSeTe subcells are electrically connected by the back buffer layer for CdSeTe subcell and the ETL of perovskite subcell.

Figure 8:
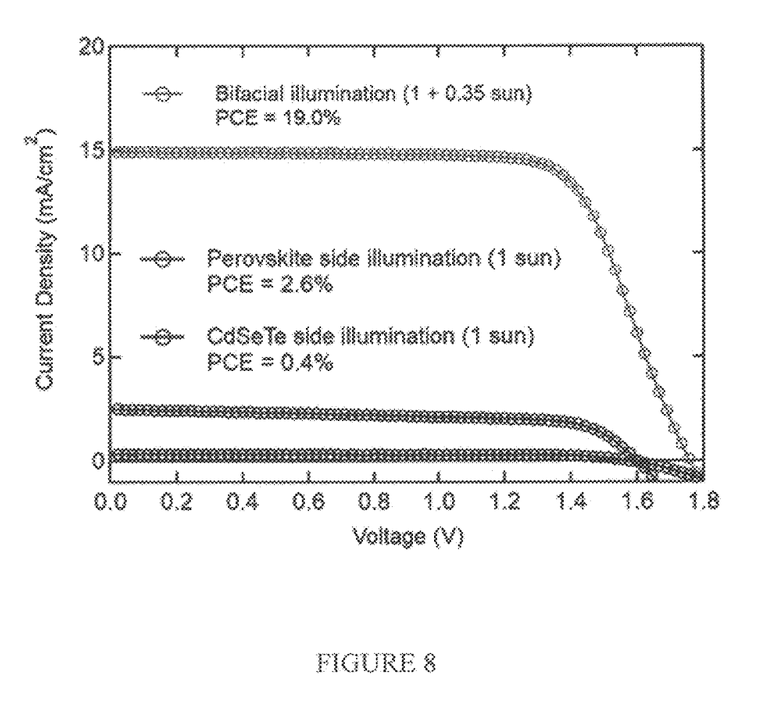
FIG. 8 is a graph displaying current density-voltage curves of a bifacial $MAPbI_3$—CdSeTe tandem solar cell illuminated concurrently with 1 sun equivalent intensity from the perovskite side and 0.35 sun equivalent intensity from the CdSeTe side and illuminated from single-side with 1 sun intensity.

An example of current density-voltage characteristics of the bifacial tandem device is shown in FIG. 8. For the bifacial illumination, one Sun intensity, equivalent to 100 mW/cm$^2$, incidents on the top side (perovskite subcell), and the secondary light with approximately 0.35 sun intensity, equivalent to 35 mW/cm$^2$, incidents on the bottom side (CdSeTe subcell). The device delivers a power conversion efficiency of 19.0% with respect to the AM1.5G standard condition and an open-circuit voltage of 1.722 V, a short circuit current density of 14.9 mA/cm$^2$, and a fill factor of 74.1%. FIG. 8 also shows the current density-voltage characteristics of the device under different light illumination conditions, including (1) front-only illumination and (2) back-only illumination, both at 1 Sun intensity. Compared with one-side illumination, bifacial illumination shows a substantial improvement in power conversion.

The bifacial design is a key to enable high-efficiency perovskite-CdSeTe tandem solar cells and modules. The tandem cells perform poorly with single-side illuminations. This is mainly because the dominant junction (p-n junction) of CdSeTe subcell is located near the glass substrate, and thus not close to the interconnecting layer. If the tandem cell is only illuminated from the perovskite side, photons passing the perovskite top cell will be absorbed in the CdSeTe region near the interconnecting layer, in which there is no effective field to separate photo-generated electron-hole pairs, resulting in a low short-circuit current density ($J_{SC}$) and open-circuit voltage ($V_{OC}$). On the other hand, if the tandem cell is only illuminated from the CdSeTe (glass) side, photons are only absorbed by the CdSeTe layer and the perovskite subcell operates in the "dark", and therefore, showing an extremely low current density. The bifacial illumination overcomes these shortfalls, leading to both high $V_{OC}$ and $J_{SC}$, and, therefore, high powder conversion efficiency.

Figure 9:
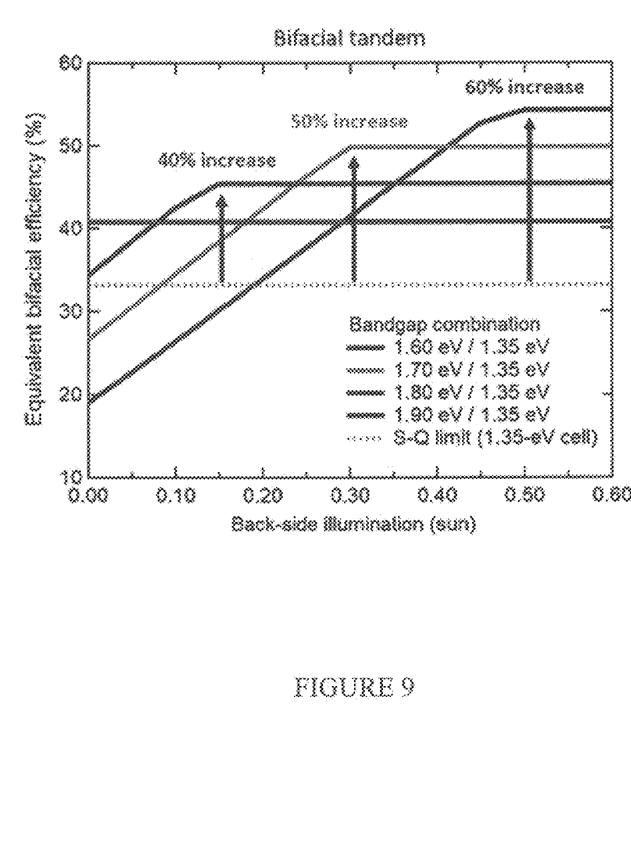
FIG. 9 is a graph displaying the detailed balance efficiency limit of bifacial tandem solar cells under different back illumination conditions.

Detailed balance efficiency analysis shown in FIG. 9 compares the maximum solar-to-electricity power conversion efficiency of the photovoltaic devices of present invention under different back illumination conditions. For various bandgap combinations of perovskite and CdSeTe, maximum efficiencies are higher than 40%, significantly higher than the efficiency limits of single-junction solar cells.

Figure 10:
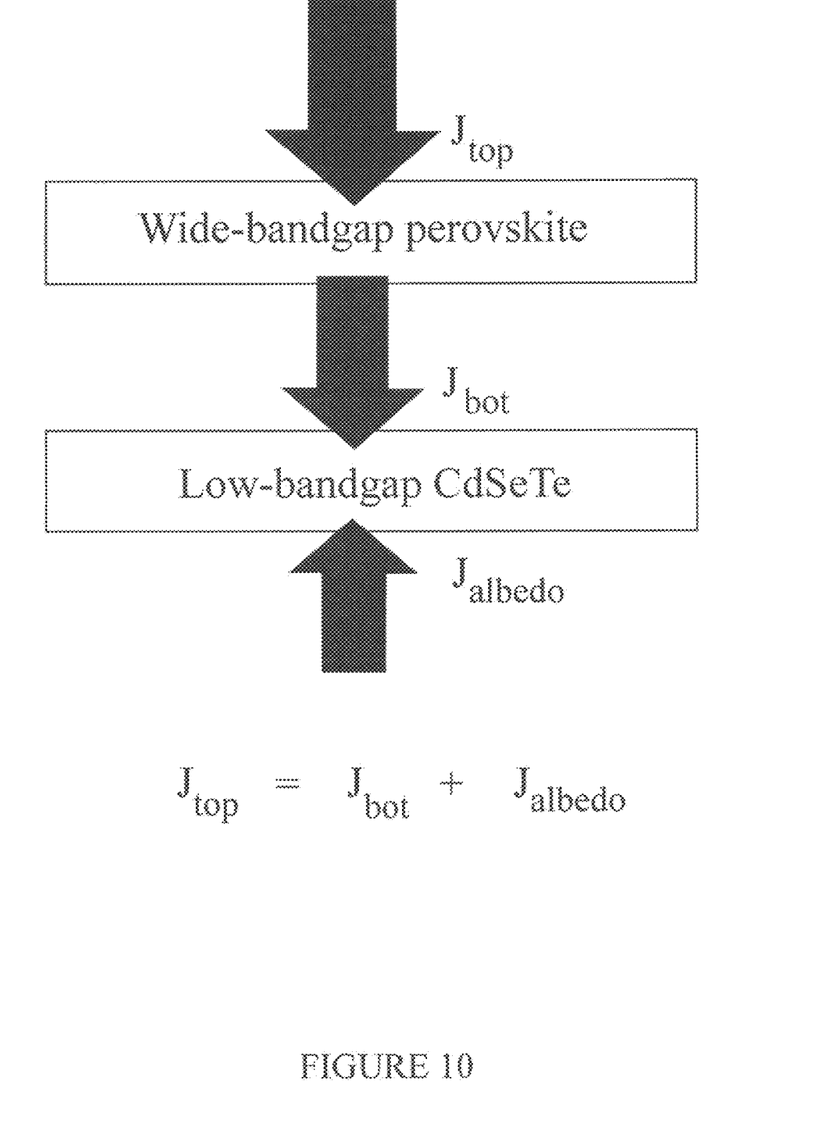
FIG. 10 is a schematic of photocurrent modulation in a bifacial tandem device by rear-side illumination (albedo light).

The photovoltaic devices of present invention allow photocurrent modulation by the rear-side illumination or albedo light. Because the two subcells in a tandem device are electrically connected in series, the current flow through the whole tandem device is constant. Therefore, the photocurrent in a tandem device is determined by the albedo light from the rear-side illumination, as shown in FIG. 10.

Figure 11:
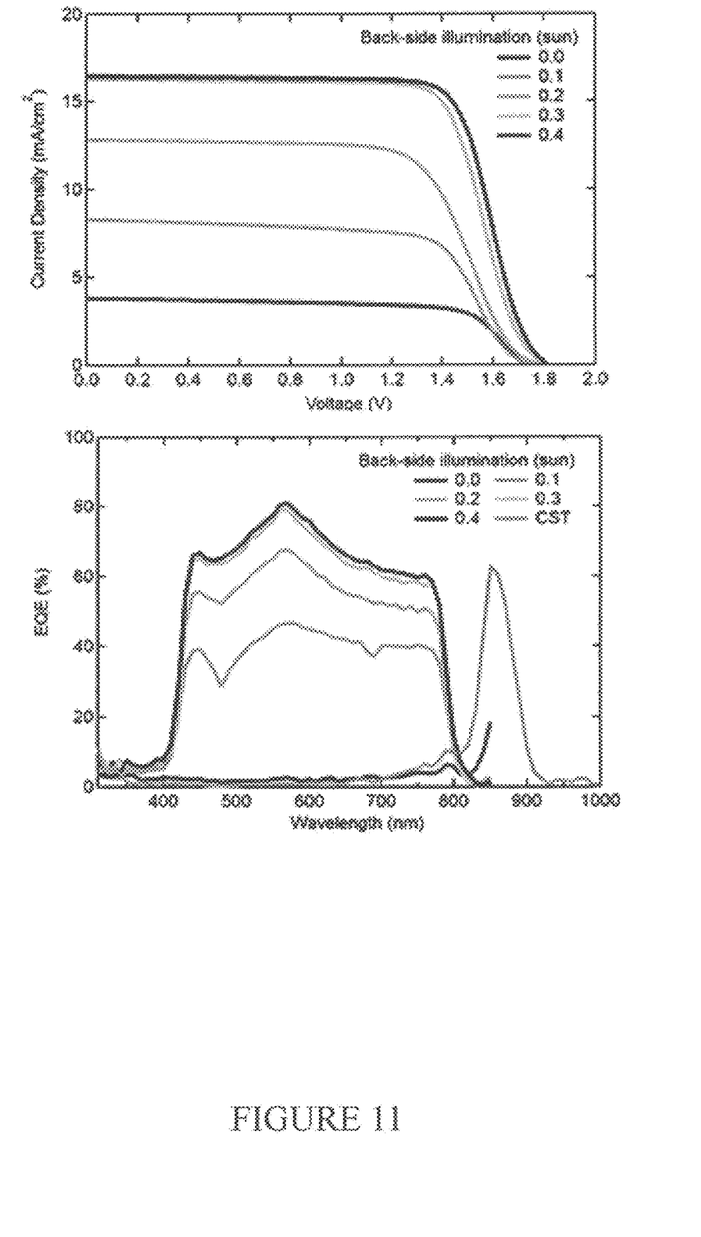
FIG. 11 is a graph displaying current density-voltage curves of a bifacial $MAPbI_3$—CdSeTe tandem solar cell illuminated concurrently with 1 sun equivalent intensity from the perovskite side and various light intensities from the CdSeTe side. External quantum efficiency curves of MAPbI$_3$ and CdSeTe subcells measured under different back-side light biasing conditions.

FIG. 11 shows an example of the photocurrent modulation of a bifacial perovskite-CdTeSe tandem device by rear-side illumination conditions. The photocurrent of the tandem cells increases with increasing the rear-side illumination intensity and saturate at above 0.4 sun intensity. The tandem devices show higher $V_{OC}$, $J_{SC}$, and fill factor with increasing rear-side illumination intensity. FIG. 9 also shows the external quantum efficiency (EQE) curves of the perovskite subcell measured under different rear-side illumination intensities, which demonstrates the photocurrent modulation effect by the rear-side illumination intensity.

Figure 12:
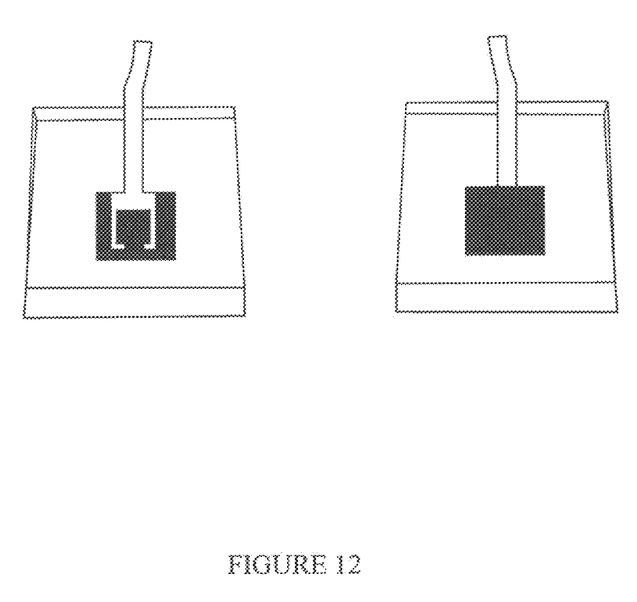
FIG. 12 is a top and bottom view of a bifacial perovskite-CdSeTe tandem device encapsulated in a glass-to-glass encapsulation.

An example of glass-to-glass encapsulation of the photovoltaic devices of the present invention using sealant, front cover glass sheet, and additional wiring or electrical connections is shown in FIG. 12. The encapsulation process is carried out in a nitrogen atmosphere to protect the perovskite subcell from degradation. A metal busbar is connected to the metal grid of the photovoltaic device and extended out of the encapsulation package as the external contact. A piece of front cover glass sheet is attached to the FTO coated glass substrate and sealed by using ultraviolet light cured epoxy. This kind of glass-to-glass encapsulation help protect perovskite subcells from degradation and make the tandem devices more durable. We observed almost no degradation of device performance after 6 months of storage of the encapsulated tandem devices in ambient air.

We claim:

1. A method of preparing a bifacial Perovskite-CdSeTe tandem solar cell comprising in the following order:

preparing a transparent conducting oxide (TCO) electrode coated glass substrate;
depositing an n-type window layer;
depositing a CdSeTe absorber layer;
forming a back buffer surface passivation layer, the n-type window layer, the CdSeTe absorber layer and the back buffer surface passivation layer forming a CdSeTe subcell;
depositing an interconnecting layer;
depositing an electron transport layer (ETL);
depositing a perovskite absorber layer;
depositing a hole transport layer (HTL), the electron transport layer (ETL), the perovskite absorber layer, and the hole transport layer (HTL) forming a perovskite subcell;
depositing a front TCO layer;
depositing a front metal grid; and
forming the bifacial Perovskite-CdSeTe tandem solar cell.

* * * * *